(12) United States Patent
Sato

(10) Patent No.: US 12,081,887 B2
(45) Date of Patent: Sep. 3, 2024

(54) IMAGING DEVICE

(71) Applicant: Panasonic Intellectual Property Management Co., Ltd., Osaka (JP)

(72) Inventor: Yoshihiro Sato, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 348 days.

(21) Appl. No.: 17/472,784

(22) Filed: Sep. 13, 2021

(65) Prior Publication Data

US 2021/0409634 A1 Dec. 30, 2021

Related U.S. Application Data

(63) Continuation of application No. PCT/JP2020/016234, filed on Apr. 13, 2020.

(30) Foreign Application Priority Data

Apr. 26, 2019 (JP) .................................. 2019-086528
Mar. 27, 2020 (JP) .................................. 2020-058618

(51) Int. Cl.
*H04N 25/75* (2023.01)
*H04N 25/701* (2023.01)
(Continued)

(52) U.S. Cl.
CPC ........... *H04N 25/75* (2023.01); *H04N 25/701* (2023.01); *H04N 25/702* (2023.01); *H01L 27/14612* (2013.01)

(58) Field of Classification Search
CPC .... H04N 25/75; H04N 25/701; H04N 25/702; H04N 25/134; H04N 25/17;
(Continued)

(56) References Cited

U.S. PATENT DOCUMENTS

2005/0230775 A1 10/2005 Watanabe et al.
2006/0278869 A1* 12/2006 Hioki ..................... H10K 30/20
257/40
(Continued)

FOREIGN PATENT DOCUMENTS

JP 2005-268471 9/2005
JP 2005-303263 10/2005
(Continued)

OTHER PUBLICATIONS

International Search Report of PCT application No. PCT/JP2020/016234 dated Jun. 30, 2020.

*Primary Examiner* — Sinh Tran
*Assistant Examiner* — Zhenzhen Wu
(74) *Attorney, Agent, or Firm* — Rimon P.C.

(57) ABSTRACT

An imaging device includes pixels. Each of the pixels includes a first photoelectric conversion layer, a first pixel electrode, a second photoelectric conversion layer, a second pixel electrode, a third photoelectric conversion layer, a third pixel electrode, a first counter electrode, and a second counter electrode. The first pixel electrode, the first photoelectric conversion layer, the first counter electrode, the second photoelectric conversion layer, the second pixel electrode, the second counter electrode, the third photoelectric conversion layer, and the third pixel electrode are arranged in this order.

23 Claims, 7 Drawing Sheets

(51) Int. Cl.
*H04N 25/702* (2023.01)
*H01L 27/146* (2006.01)

(58) Field of Classification Search
CPC ......... H01L 27/14612; H01L 27/14638; H01L 27/14667; H01L 31/10; H10K 30/00; Y02E 10/549
See application file for complete search history.

(56) References Cited

U.S. PATENT DOCUMENTS

| | | | |
|---|---|---|---|
| 2007/0120045 A1* | 5/2007 | Yokoyama ............. | H10K 39/32 |
| | | | 250/214 R |
| 2007/0268443 A1* | 11/2007 | Tanno ................. | G02F 1/13452 |
| | | | 349/149 |
| 2010/0276670 A1* | 11/2010 | Shen .................... | H10K 30/353 |
| | | | 257/E51.027 |
| 2019/0214417 A1 | 7/2019 | Matsuo | |
| 2021/0104564 A1* | 4/2021 | Kawai .............. | H01L 27/14627 |

FOREIGN PATENT DOCUMENTS

| | | |
|---|---|---|
| JP | 2013-055252 | 3/2013 |
| JP | 2018-046039 | 3/2018 |

* cited by examiner

IMAGING DEVICE

BACKGROUND

1. Technical Field

The present disclosure relates to an imaging device.

2. Description of the Related Art

Imaging devices using photoelectric conversion have hitherto been widely used.

Japanese Unexamined Patent Application Publication No. 2005-268471 discloses an imaging device including multiple photoelectric conversion films.

SUMMARY

In one general aspect, the techniques disclosed here feature an imaging device including pixels. Each of the pixels includes a first photoelectric conversion layer that converts light into first electric charge, a first pixel electrode that collects the first electric charge, a second photoelectric conversion layer that is arranged below the first photoelectric conversion layer and that converts light into second electric charge, a second pixel electrode that collects the second electric charge, a third photoelectric conversion layer that is arranged below the second photoelectric conversion layer and that converts light into third electric charge, a third pixel electrode that collects the third electric charge, a first counter electrode that is arranged between the first photoelectric conversion layer and the second photoelectric conversion layer, and a second counter electrode that is arranged between the second photoelectric conversion layer and the third photoelectric conversion layer. The first pixel electrode, the first photoelectric conversion layer, the first counter electrode, the second photoelectric conversion layer, the second pixel electrode, the second counter electrode, the third photoelectric conversion layer, and the third pixel electrode are arranged in this order.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
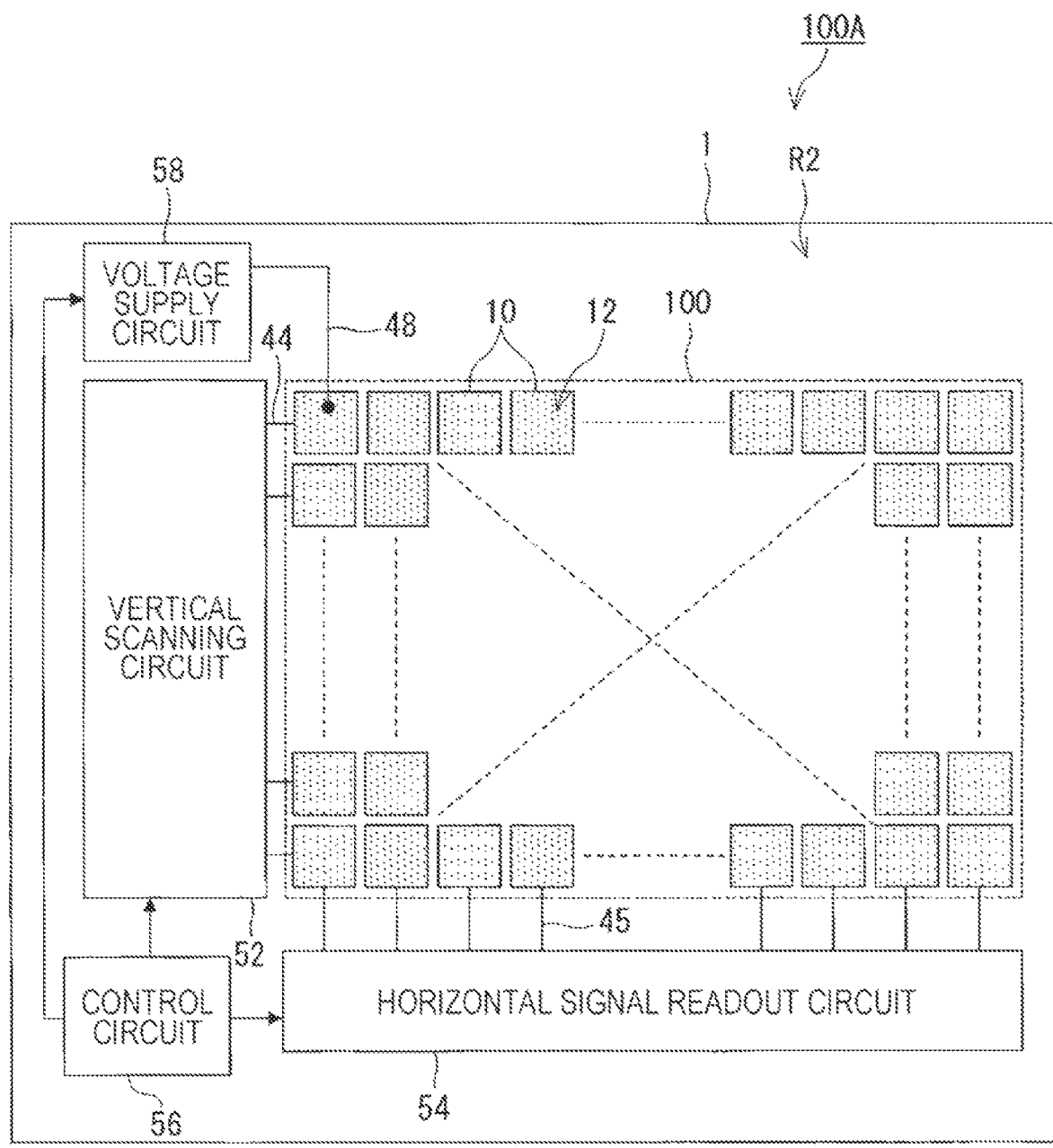
FIG. 1 is a configuration diagram of an imaging apparatus according to a first embodiment of the present disclosure.

Underlying Knowledge Forming Basis of the Present Disclosure

The inventors have conducted a review of the cause to prevent an improvement of the quality of images generated by an imaging device disclosed in Japanese Unexamined Patent Application Publication No. 2005-268471. As a result, the inventors have found the following problem.

In the imaging device disclosed in Japanese Unexamined Patent Application Publication No. 2005-268471, pixel electrodes for extracting a signal from a photoelectric conversion film are vertically adjacent to each other. Specifically, a common electrode film corresponding to a counter electrode is arranged on a top layer, and the photoelectric conversion film is arranged between the common electrode film and counter electrode films corresponding to the pixel electrodes. Since no columnar electrode corresponding to a plug passes through the photoelectric conversion film on the top layer, this configuration has an advantage in manufacturing. However, since the counter electrode films are opposed to each other via insulating layers, capacitive coupling is likely to occur and electrical color mixture is likely to occur. Suppression of the electrical color mixture caused by the capacitive coupling is advantageous to the improvement of the image quality.

The present disclosure provides a technique to reduce the coupling capacitance between the pixel electrodes to suppress the electrical color mixture.

Summary of One Aspect According to the Present Disclosure

An imaging device according to a first aspect of the present disclosure includes pixels.

Each of the pixels includes
a first photoelectric conversion layer that converts light into first electric charge,
a first pixel electrode that collects the first electric charge,
a second photoelectric conversion layer that is arranged below the first photoelectric conversion layer and that converts light into second electric charge,
a second pixel electrode that collects the second electric charge,
a third photoelectric conversion layer that is arranged below the second photoelectric conversion layer and that converts light into third electric charge,
a third pixel electrode that collects the third electric charge,
a first counter electrode that is arranged between the first photoelectric conversion layer and the second photoelectric conversion layer, and
a second counter electrode that is arranged between the second photoelectric conversion layer and the third photoelectric conversion layer.

The first pixel electrode, the first photoelectric conversion layer, the first counter electrode, the second photoelectric conversion layer, the second pixel electrode, the second counter electrode, the third photoelectric conversion layer, and the third pixel electrode are arranged in this order.

According to the first aspect, it is possible to improve the image quality. Specifically, it is possible to reduce the coupling capacitance between the pixel electrodes to suppress the electrical color mixture.

Voltage applied to the first photoelectric conversion layer and voltage applied to the second photoelectric conversion layer may be set by the first counter electrode.

An imaging device according to a second aspect of the present disclosure includes pixels.

Each of the pixels includes
- a first photoelectric conversion layer that converts light into first electric charge,
- a first pixel electrode that collects the first electric charge,
- a second photoelectric conversion layer that is arranged below the first photoelectric conversion layer and that converts light into second electric charge,
- a second pixel electrode that collects the second electric charge,
- a third photoelectric conversion layer that is arranged below the second photoelectric conversion layer and that converts light into third electric charge,
- a third pixel electrode that collects the third electric charge,
- a first counter electrode that is arranged between the first photoelectric conversion layer and the second photoelectric conversion layer, and
- a second counter electrode that is arranged between the second photoelectric conversion layer and the third photoelectric conversion layer.

The first pixel electrode, the first photoelectric conversion layer, the first counter electrode, the second pixel electrode, the second photoelectric conversion layer, the second counter electrode, the third photoelectric conversion layer, and the third pixel electrode are arranged in this order.

According to the second aspect, it is possible to improve the image quality. Specifically, it is possible to reduce the coupling capacitance between the pixel electrodes to suppress the electrical color mixture.

Voltage applied to the second photoelectric conversion layer and voltage applied to the third photoelectric conversion layer may be set by the second counter electrode.

In a third aspect of the present disclosure, for example, in the imaging device according to the first or second aspect, the first counter electrode may be thicker than the second counter electrode. According to the third aspect, it is possible to relieve the unevenness of the top face of an insulating layer formed in manufacturing of the imaging device.

In a fourth aspect of the present disclosure, for example, in the imaging device according to the first or second aspect, the second counter electrode may be thicker than the first counter electrode. According to the fourth aspect, parasitic sensitivity may be reduced.

In a fifth aspect of the present disclosure, for example, in the imaging device according to the first aspect, the first counter electrode may be thicker than the first pixel electrode. According to the fifth aspect, an advantageous effect to suppress a reduction in bias voltage caused by the resistance value of the first counter electrode is achieved.

In a sixth aspect of the present disclosure, for example, in the imaging device according to the first aspect, the first counter electrode may be thicker than the second pixel electrode. According to the sixth aspect, the advantageous effect to suppress a reduction in bias voltage caused by the resistance value of the first counter electrode is achieved.

In a seventh aspect of the present disclosure, for example, in the imaging device according to the first aspect, the second counter electrode may be thicker than the third pixel electrode. According to the seventh aspect, an advantageous effect to suppress a reduction in bias voltage caused by the resistance value of the second counter electrode is achieved.

In an eighth aspect of the present disclosure, for example, in the imaging device according to the second aspect, the first counter electrode may be thicker than the first pixel electrode. According to the eighth aspect, the advantageous effect to suppress a reduction in bias voltage caused by the resistance value of the first counter electrode is achieved.

In a ninth aspect of the present disclosure, for example, in the imaging device according to the second aspect, the second counter electrode may be thicker than the second pixel electrode. According to the ninth aspect, the advantageous effect to suppress a reduction in bias voltage caused by the resistance value of the second counter electrode is achieved.

In a tenth aspect of the present disclosure, for example, in the imaging device according to the second aspect, the second counter electrode may be thicker than the third pixel electrode. According to the tenth aspect, the advantageous effect to suppress a reduction in bias voltage caused by the resistance value of the second counter electrode is achieved.

In an eleventh aspect of the present disclosure, for example, the imaging device according to any of the first to tenth aspects may further includes a semiconductor substrate. The first pixel electrode may include a first storage electrode that stores the first electric charge in the first photoelectric conversion layer and a first readout electrode that is electrically connected to the semiconductor substrate. The second pixel electrode may include a second storage electrode that stores the second electric charge in the second photoelectric conversion layer and a second readout electrode that is electrically connected to the semiconductor substrate. The third pixel electrode may include a third storage electrode that stores the third electric charge in the third photoelectric conversion layer and a third readout electrode that is electrically connected to the semiconductor substrate.

An imaging device according to a twelfth aspect of the present disclosure includes pixels.

Each of the pixels includes
- a first photoelectric conversion layer,
- a first pixel electrode that collects electric charge generated in the first photoelectric conversion layer,
- a second photoelectric conversion layer that is arranged below the first photoelectric conversion layer,
- a second pixel electrode that collects electric charge generated in the second photoelectric conversion layer,
- a third photoelectric conversion layer that is arranged below the second photoelectric conversion layer,
- a third pixel electrode that collects electric charge generated in the third photoelectric conversion layer,
- a first counter electrode that is arranged between the first photoelectric conversion layer and the second photoelectric conversion layer and that is shared between the first photoelectric conversion layer and the second photoelectric conversion layer, and
- a second counter electrode that is arranged between the second photoelectric conversion layer and the third photoelectric conversion layer.

According to the twelfth aspect, it is possible to improve the image quality. Specifically, it is possible to reduce the coupling capacitance between the pixel electrodes to suppress the electrical color mixture.

An imaging device according to a thirteenth aspect of the present disclosure includes pixels.

Each of the pixels includes
- a first photoelectric conversion layer,
- a first pixel electrode that collects electric charge generated in the first photoelectric conversion layer, a second photoelectric conversion layer that is arranged below the first photoelectric conversion layer, a second pixel electrode that collects electric charge generated in the second photoelectric conversion layer, a third photoelectric conversion layer that is arranged below the second photoelectric conversion layer, a third pixel electrode that collects electric charge generated in the third photoelectric conversion layer, a first counter electrode that is arranged between the first photoelectric conversion layer and the second photoelectric conversion layer, and a second counter electrode that is arranged between the second photoelectric conversion layer and the third photoelectric conversion layer and that is shared between the second photoelectric conversion layer and the third photoelectric conversion layer.

According to the thirteenth aspect, it is possible to improve the image quality. Specifically, it is possible to reduce the coupling capacitance between the pixel electrodes to suppress the electrical color mixture.

In a fourteenth aspect of the present disclosure, the second photoelectric conversion layers in two adjacent pixels, among the pixels, may be electrically connected to each other. In the fourteenth aspect of the present disclosure, the pixels may include a first pixel and a second pixel adjacent to the first pixel, and the second photoelectric conversion layer of the first pixel may be electrically connected to the second photoelectric conversion layer of the second pixel. In a fifteenth aspect of the present disclosure, for example, in the imaging device according to the first aspect, each of the plurality of pixels may include no photoelectric conversion layer between the second pixel electrode and the second counter electrode. In a sixteenth aspect of the present disclosure, for example, in the imaging device according to the first aspect, each of the plurality of pixels may further include a fourth photoelectric conversion layer that is arranged below the third photoelectric conversion layer and that converts light into fourth electric charge, a fourth pixel electrode that collects the fourth electric charge, and a third counter electrode that is arranged between the fourth photoelectric conversion layer and the third pixel electrode. In a seventeenth aspect of the present disclosure, for example, in the imaging device according to the second aspect, each of the plurality of pixels may include no photoelectric conversion layer between the first counter electrode and the second pixel electrode.

Embodiments of the present disclosure will herein be described with reference to the drawings. The present disclosure is not limited to the following embodiments.

First Embodiment

FIG. 1 illustrates the configuration of an imaging apparatus 100A according to a first embodiment of the present disclosure. The imaging apparatus 100A includes an imaging device 100. The imaging device 100 includes a semiconductor substrate 1 and multiple pixels 10. The multiple pixels 10 are provided on the semiconductor substrate 1. The respective pixels 10 are supported by the semiconductor substrate 1. Part of the pixels 10 may be composed of the semiconductor substrate 1.

The semiconductor substrate 1 may be a circuit board including various electronic circuits. The semiconductor substrate 1 is composed of, for example, a Si substrate.

Each pixel 10 includes a photoelectric converter 12. The photoelectric converter 12 generates positive electric charge and negative electric charge, typically, a pair of hole and electron in response to incident light. The photoelectric converter 12 includes at least one photoelectric conversion layer arranged above the semiconductor substrate 1. The photoelectric converters 12 of the respective pixels 10 are spatially separated in FIG. 1 for convenience of description. The photoelectric converters 12 of the multiple pixels 10 may be continuously arranged on the semiconductor substrate 1 with no space therebetween.

Referring to FIG. 1, the pixels 10 are aligned in multiple rows and multiple columns, specifically, in an m-number rows and an n-number columns. Here, m and n each independently represents an integer of one or more. The pixels 10 are, for example, two-dimensionally aligned on the semiconductor substrate 1 to form an imaging area. In a plan view of the imaging apparatus 100A, the imaging device 100 may be defined as an area where the photoelectric conversion layers exist.

The number and the arrangement of the pixels 10 are not particularly restricted. The center of each pixel 10 is positioned on a grip point of a square grip in FIG. 1. The multiple pixels 10 may be arranged so that the center of each pixel 10 is positioned on the grid point of a triangle grid, a hexagonal grid, or the like. The imaging device 100 may be used as a line sensor by one-dimensionally aligning the pixels 10.

The imaging apparatus 100A includes peripheral circuits formed on the semiconductor substrate 1.

The peripheral circuits include a vertical scanning circuit 52 and a horizontal signal readout circuit 54. The peripheral circuits may additionally include a control circuit 56 and a voltage supply circuit 58. The peripheral circuits may further include a signal processing circuit, an output circuit, and so on. The respective circuits are provided on the semiconductor substrate 1. Part of the peripheral circuits may be arranged on another substrate different from the semiconductor substrate 1 on which the pixels 10 are formed.

The vertical scanning circuit 52 is also referred to as a row scanning circuit. An address signal line 44 is provided for each row composed of the multiple pixels 10 and the address signal lines 44 are connected to the vertical scanning circuit 52. The signal line provided for each row composed of the multiple pixels 10 is not limited to the address signal line 44 and multiple kinds of signal lines may be connected to the vertical scanning circuit 52 for the respective rows each composed of the multiple pixels 10. The horizontal signal readout circuit 54 is also referred to as a column scanning circuit. A vertical signal line 45 is provided for each column composed of the multiple pixels 10 and the vertical signal lines 45 are connected to the horizontal signal readout circuit 54.

The control circuit 56 controls the entire imaging apparatus 100A in response to instruction data, a clock signal, and so on supplied from the outside of the imaging apparatus 100A. Typically, the control circuit 56 includes a timing generator and supplies a driving signal to the vertical scanning circuit 52, the horizontal signal readout circuit 54, the voltage supply circuit 58, and so on. The control circuit 56 may be realized by a microcontroller including one or more processors. The function of the control circuit 56 may be realized through combination of a general-purpose processing circuit with software or may be realized by hardware dedicated to such processing.

The voltage supply circuit 58 supplies a certain voltage to each pixel 10 via a voltage line 48. The voltage supply circuit 58 is not limited to a certain power supply circuit and may be a circuit that converts voltage supplied from a power supply, such as a battery, into the certain voltage or a circuit that generates the certain voltage. The voltage supply circuit 58 may be part of the vertical scanning circuit 52 described above. These circuits composing the peripheral circuits may be arranged in a peripheral area R2 outside the imaging device 100.

Figure 2A:
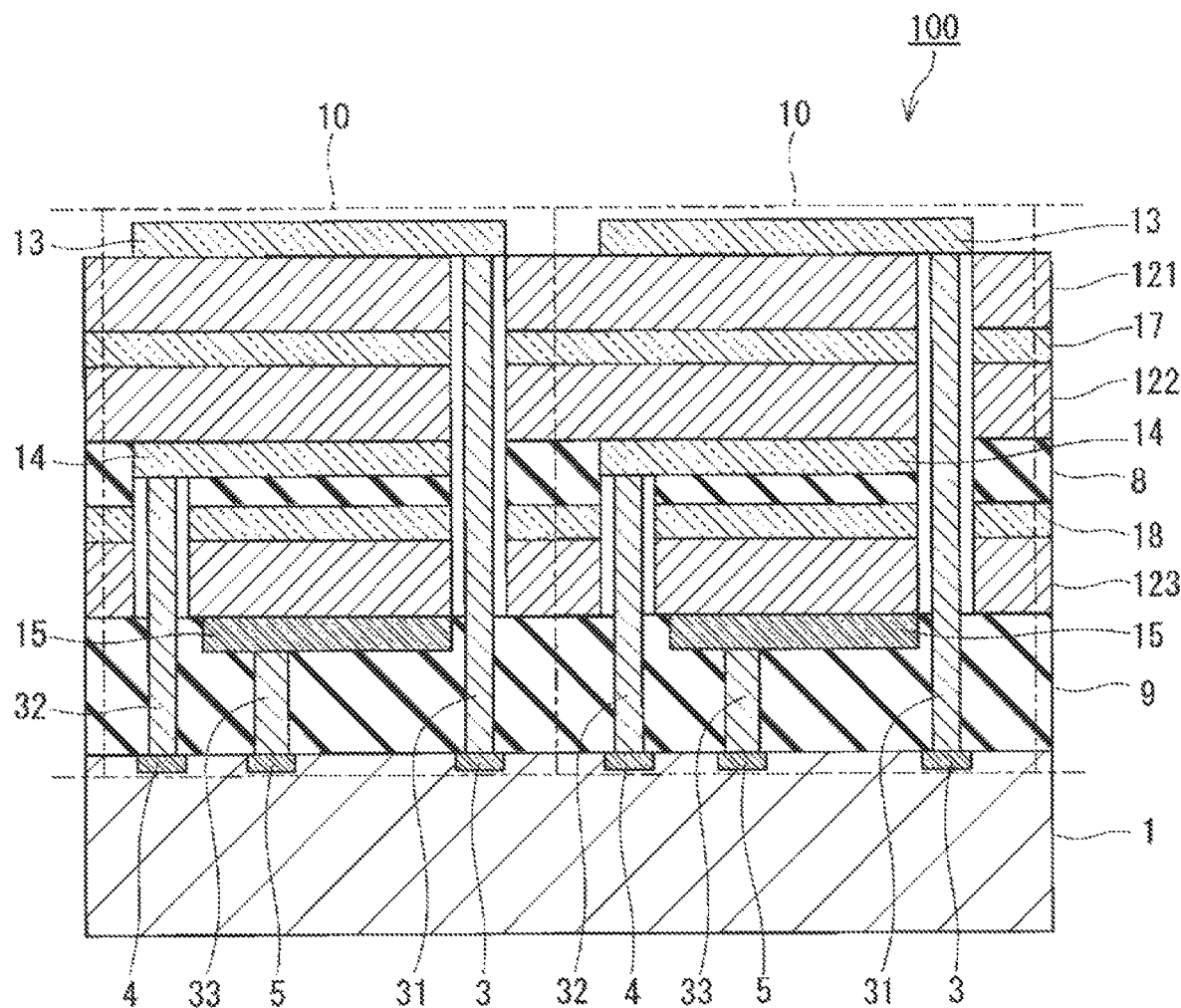
FIG. 2A is a cross-sectional view of an imaging device illustrated in FIG. 1.

FIG. 2A illustrates a cross section of the imaging device 100.

Each pixel 10 includes multiple photoelectric conversion layers 121, 122, and 123. The multiple photoelectric conversion layers 121, 122, and 123 include a first photoelectric conversion layer 121, a second photoelectric conversion layer 122, and a third photoelectric conversion layer 123. The first photoelectric conversion layer 121 may be a single layer shared between the multiple pixels 10. The second photoelectric conversion layer 122 may be a single layer shared between the multiple pixels 10. The third photoelectric conversion layer 123 may be a single layer shared between the multiple pixels 10. However, each of the photoelectric conversion layers 121, 122, and 123 may be isolated for each pixel. The "sharing between the multiple pixels" means sharing between a certain pixel and at least one pixel adjacent to the certain pixel.

The following structure may be adopted regardless of whether the case in which each of the photoelectric conversion layers 121, 122, and 123 is a single layer or the case in which each of the photoelectric conversion layers 121, 122, and 123 is isolated for each pixel is supposed. The first photoelectric conversion layer 121 in a certain pixel and the first photoelectric conversion layer 121 in the pixel adjacent to the certain pixel are electrically connected to each other. The second photoelectric conversion layer 122 in a certain pixel and the second photoelectric conversion layer 122 in the pixel adjacent to the certain pixel are electrically connected to each other. The third photoelectric conversion layer 123 in a certain pixel and the third photoelectric conversion layer 123 in the pixel adjacent to the certain pixel are electrically connected to each other. In other words, a part of the first photoelectric conversion layer 121 in a certain pixel 10 (a first pixel) arbitrarily selected from the multiple pixels 10 is electrically connected to a part of the first photoelectric conversion layer 121 in the pixel 10 adjacent to the certain pixel 10, among the multiple pixels 10. A part of the second photoelectric conversion layer 122 in a certain pixel 10 (a second pixel) arbitrarily selected from the multiple pixels 10 is electrically connected to a part of the second photoelectric conversion layer 122 in the pixel 10 adjacent to the certain pixel 10, among the multiple pixels 10. A part of the third photoelectric conversion layer 123 in a certain pixel 10 (a third pixel) arbitrarily selected from the multiple pixels 10 is electrically connected to a part of the third photoelectric conversion layer 123 in the pixel 10 adjacent to the certain pixel 10, among the multiple pixels 10. Application of the technique of the present disclosure to such a structure achieves the advantageous effect to suppress the color mixture between the pixels.

The photoelectric conversion layers 121, 122, and 123 are made of a photoelectric conversion material. The photoelectric conversion material is typically an organic material.

The first photoelectric conversion layer 121 collects electric charge (first electric charge) corresponding to light in a first wavelength region. The second photoelectric conversion layer 122 collects electric charge (second electric charge) corresponding to light in a second wavelength region. The third photoelectric conversion layer 123 collects electric charge (third electric charge) corresponding to light in a third wavelength region. The first wavelength region is, for example, the wavelength region of blue light. The first photoelectric conversion layer 121 is made of a material having sensitivity to blue light. The second wavelength region is, for example, the wavelength region of green light. The second photoelectric conversion layer 122 is made of a material having sensitivity to green light. The third wavelength region is, for example, the wavelength region of red light. The third photoelectric conversion layer 123 is made of a material having sensitivity to red light.

In the first embodiment, the first photoelectric conversion layer 121, the second photoelectric conversion layer 122, the third photoelectric conversion layer 123, and the semiconductor substrate 1 are layered in this order. The second photoelectric conversion layer 122 is arranged below the first photoelectric conversion layer 121. The third photoelectric conversion layer 123 is arranged below the second photoelectric conversion layer 122. In a normal direction of the semiconductor substrate 1, the second photoelectric conversion layer 122 is arranged between the first photoelectric conversion layer 121 and the semiconductor substrate 1. In the normal direction of the semiconductor substrate 1, the third photoelectric conversion layer 123 is arranged between the second photoelectric conversion layer 122 and the semiconductor substrate 1. The order of layering of the photoelectric conversion layers 121, 122, and 123 is not limited to this order. Since the photoelectric conversion material absorbing blue light generally has low sensitivity, the layer having sensitivity to blue light is advantageously used as a top layer.

In this specification, "upper" and "lower" are determined based on the traveling direction of light. The side closer to a light incident plane is referred to as the "upper" side and the side away from the light incident plane is referred to as the "lower" side.

Each pixel 10 further includes multiple pixel electrodes 13, 14, and 15. The multiple pixel electrodes 13, 14, and 15 include a first pixel electrode 13, a second pixel electrode 14, and a third pixel electrode 15. The first pixel electrode 13 is electrically connected to the first photoelectric conversion layer 121. The second pixel electrode 14 is electrically connected to the second photoelectric conversion layer 122. The third pixel electrode 15 is electrically connected to the third photoelectric conversion layer 123.

The first pixel electrode 13 and the second pixel electrode 14 are transparent electrodes having light transmittance to visible light and/or near-infrared light. The transparent electrode is made of transparent conductive oxide, such as indium tin oxide (ITO). The third pixel electrode 15 is a non-transparent electrode that does not have the light transmittance to the visible light and/or the near-infrared light. The material of the non-transparent electrode is, for example, metal, metal oxide, metal nitride, or conductive polysilicon.

In this specification, "having the light transmittance" means that the transmittance of light of a certain wavelength region is higher than or equal to 40%. The wavelength region of the visible light is, for example, 400 nm to 780 nm. The wavelength region of the near-infrared light is, for example, 780 nm to 2,000 nm. The transmittance can be calculated using a method defined in Japanese Industrial Standards JIS 83106 (1998).

Each pixel 10 further includes multiple counter electrodes 17 and 18. The multiple counter electrodes 17 and 18 include a first counter electrode 17 and a second counter electrode 18. Each of the counter electrodes 17 and 18 may be a transparent electrode having the light transmittance to the visible light and/or the near-infrared light.

The first counter electrode 17 may be a single layer shared between the multiple pixels 10. The second counter electrode 18 may be a single layer shared between the multiple pixels 10. However, each of the counter electrodes 17 and 18 may be isolated for each pixel.

The following structure may be adopted regardless of whether the case in which each of the counter electrodes 17 and 18 is a single layer or the case in which each of the counter electrodes 17 and 18 is isolated for each pixel is supposed. Specifically, a part of the first counter electrode 17 in a certain pixel 10 arbitrarily selected from the multiple pixels 10 is electrically connected to a part of the first counter electrode 17 in the pixel 10 adjacent to the certain pixel 10. A part of the second counter electrode 18 in a certain pixel 10 arbitrarily selected from the multiple pixels 10 is electrically connected to a part of the second counter electrode 18 in the pixel 10 adjacent to the certain pixel 10.

Figure 2B:
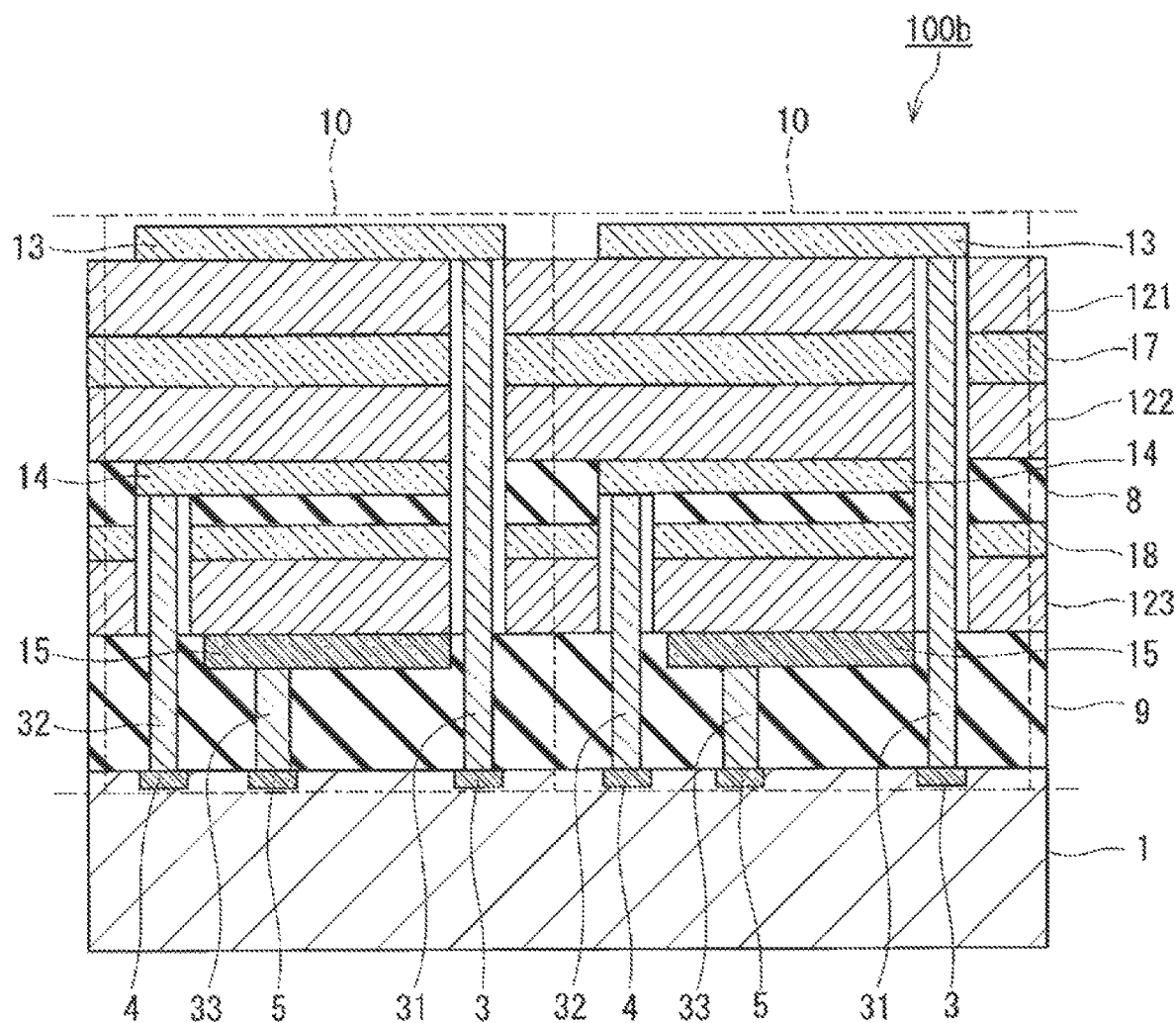
FIG. 2B is a cross-sectional view of an imaging device having another configuration of multiple counter electrodes.
Figure 2C:
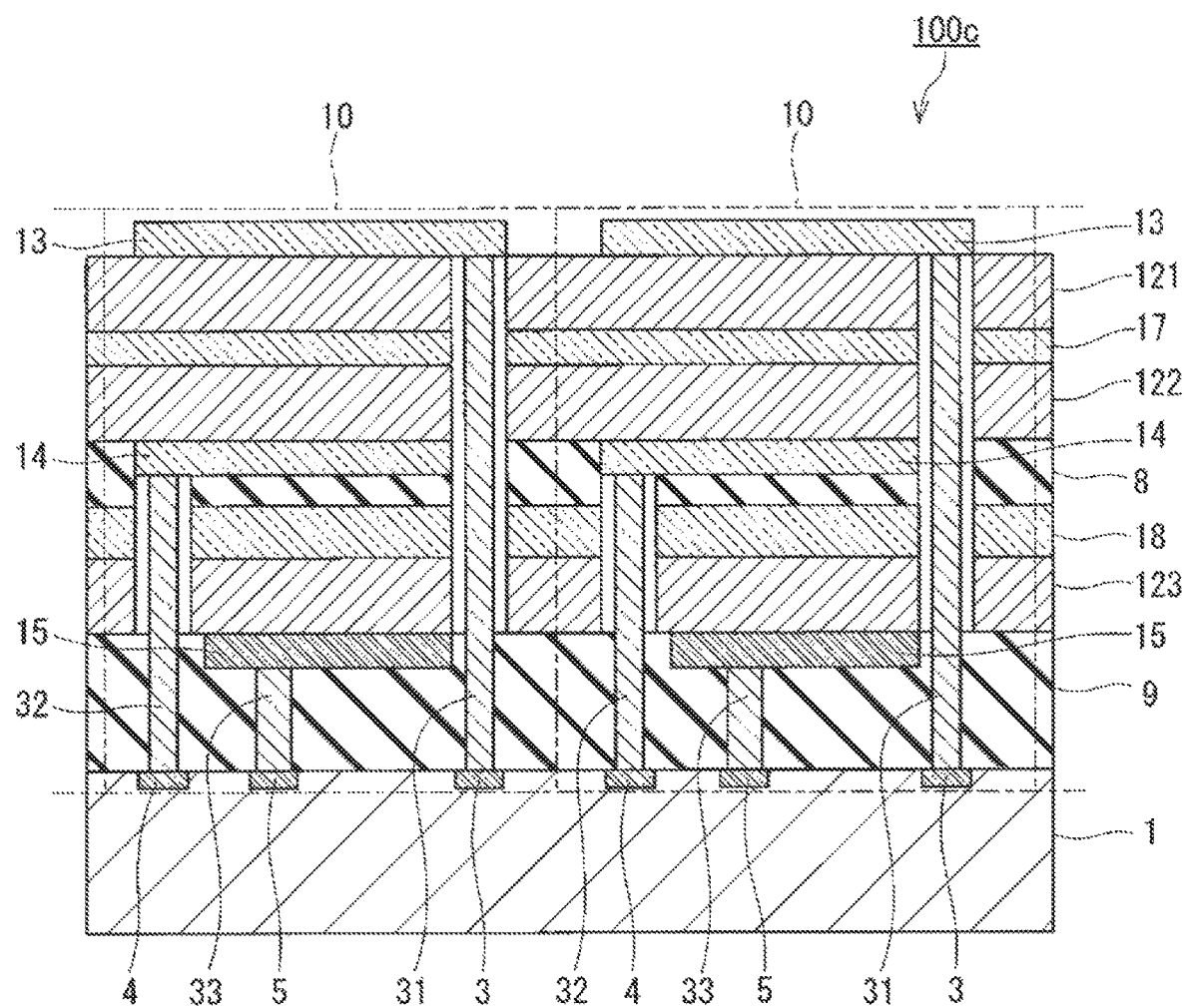
FIG. 2C is a cross-sectional view of an imaging device having another configuration of the multiple counter electrodes.

FIG. 2B illustrates an imaging device 100b having another configuration of the multiple counter electrodes 17 and 18. FIG. 2C illustrates an imaging device 100c having another configuration of the multiple counter electrodes 17 and 18. As illustrated in FIG. 2B and FIG. 2C, the multiple counter electrodes 17 and 18 may have different thicknesses.

For example, as illustrated in FIG. 2B, the first counter electrode 17 may be thicker than the second counter electrode 18. In other words, the thickness of the counter electrode may be increased as the counter electrode comes closer to the light incident plane from the semiconductor substrate 1. With this configuration, it is possible to relieve the unevenness of the top face of an insulating layer formed in manufacturing of the imaging device 100.

Alternatively, as illustrated in FIG. 2C, the second counter electrode 18 may be thicker than the first counter electrode 17. In other words, the thickness of the counter electrode may be increased as the counter electrode comes closer to the semiconductor substrate 1 from the light incident plane. With this configuration, the photoelectric conversion caused by the incidence of light on the semiconductor substrate 1 may be further suppressed to reduce parasitic sensitivity.

The thickness of the pixel electrode can be determined by the following method. A cross section parallel to the normal direction of the semiconductor substrate 1 is formed. The cross section is observed using an electron microscope (for example, a scanning electron microscope). The thickness of the pixel electrode is measured at multiple arbitrary positions (for example, five positions) included in the generated image. The average of the measured values is determined to be the thickness of the pixel electrode. The "thickness" is the dimension in a direction parallel to the normal direction of the semiconductor substrate 1. The thickness of the counter electrode can be determined using the same method as in the pixel electrode.

As illustrated in FIG. 2A, an insulating layer 8 is provided between the second pixel electrode 14 and the second counter electrode 18. An insulating layer 9 is provided between the third pixel electrode 15 and the semiconductor substrate 1. The insulating layers 8 and 9 are made of an insulating material, such as $SiO_2$.

The insulating layers 8 and 9 may have different permittivities. For example, the permittivity of the insulating layer 8 may be lower than the permittivity of the insulating layer 9. This may achieve the advantageous effect to suppress the capacitive coupling between the third pixel electrode 15 and the second pixel electrode 14. In order to differentiate the permittivity, an appropriate material may be selected from $SiO_2$, SiOF, SiOC, and so on for usage. The permittivity may be differentiated using the same material.

Each pixel 10 further includes multiple plugs 31, 32, and 33. The respective plugs 31, 32, and 33 extend in the normal direction of the semiconductor substrate 1. The multiple plugs 31, 32, and 33 include a first plug 31, a second plug 32, and a third plug 33. The semiconductor substrate 1 is electrically connected to the first pixel electrode 13 with the first plug 31. The semiconductor substrate 1 is electrically connected to the second pixel electrode 14 with the second plug 32. The semiconductor substrate 1 is electrically connected to the third pixel electrode 15 with the third plug 33.

The plugs 31, 32, and 33 are made of a conductive material. The conductive material is, for example, metal, metal oxide, metal nitride, or conductive polysilicon.

The semiconductor substrate 1 includes multiple charge accumulation regions 3, 4, and 5. The charge accumulation regions 3, 4, and 5 may be part of each pixel 10. Each of the charge accumulation regions 3, 4, and 5 is an n-type or p-type impurity region. The multiple charge accumulation regions 3, 4, and 5 include a first charge accumulation region 3, a second charge accumulation region 4, and a third charge accumulation region 5. The first charge accumulation region 3 is electrically connected to the first pixel electrode 13 with the first plug 31. The second charge accumulation region 4 is electrically connected to the second pixel electrode 14 with the second plug 32. The third charge accumulation region 5 is electrically connected to the third pixel electrode 15 with the third plug 33.

Each pixel 10 may include a microlens. The microlenses may be arranged so as to compose the surface of the imaging device 100. One microlens or multiple microlenses may be arranged for one pixel 10. The microlens may be arranged so as to condense light on an area where the first pixel electrode 13 is overlapped with the second pixel electrode 14 in a plan view of the imaging device 100.

The semiconductor substrate 1 may include multiple transistors for reading out the electric charge stored in the charge accumulation regions 3, 4, and 5 and resetting the stored electric charge.

The pixel electrodes may be electrically connected to the charge accumulation regions via the plugs through the semiconductor substrate and the wiring layer at the lower side of the semiconductor substrate.

A pair of electron and hole is generated in each of the photoelectric conversion layers 121, 122, and 123 upon irradiation of the imaging device 100 with the light.

For example, upon application of voltage between the first counter electrode 17 and the first pixel electrode 13 so that the potential of the first counter electrode 17 exceeds the potential of the first pixel electrode 13, the hole, which is the positive electric charge, is collected in the first pixel electrode 13 and the electron, which is the negative electric charge, is collected in the first counter electrode 17. The hole collected in the first pixel electrode 13 is stored in the first plug 31 and the first charge accumulation region 3.

Upon application of voltage between the first counter electrode 17 and the second pixel electrode 14 so that the potential of the first counter electrode 17 exceeds the potential of the second pixel electrode 14, the hole, which is the positive electric charge, is collected in the second pixel electrode 14 and the electron, which is the negative electric charge, is collected in the first counter electrode 17. The hole collected in the second pixel electrode 14 is stored in the second plug 32 and the second charge accumulation region 4.

The thickness of the first counter electrode 17 may be different from the thickness of the first pixel electrode 13. The first counter electrode 17 may be thicker than the first pixel electrode 13, as illustrated in FIG. 2B. Increasing the thickness of the first counter electrode 17 may decrease the resistance value of the first counter electrode 17. This achieves the advantageous effect to suppress a reduction in bias voltage caused of the resistance value of the first counter electrode 17.

The thickness of the first counter electrode 17 may be different from the thickness of the second pixel electrode 14. The first counter electrode 17 may be thicker than the second pixel electrode 14, as illustrated in FIG. 2B. Increasing the thickness of the first counter electrode 17 may decrease the resistance value of the first counter electrode 17. This achieves the advantageous effect to suppress the reduction in bias voltage caused of the resistance value of the first counter electrode 17.

Upon application of voltage between the second counter electrode 18 and the third pixel electrode 15 so that the potential of the second counter electrode 18 exceeds the potential of the third pixel electrode 15, the hole, which is the positive electric charge, is collected in the third pixel electrode 15 and the electron, which is the negative electric charge, is collected in the second counter electrode 18. The hole collected in the third pixel electrode 15 is stored in the third plug 33 and the third charge accumulation region 5.

The thickness of the second counter electrode 18 may be different from the thickness of the third pixel electrode 15. The second counter electrode 18 may be thicker than the third pixel electrode 15, as illustrated in FIG. 2C. Increasing the thickness of the second counter electrode 18 may decrease the resistance value of the second counter electrode 18. This achieves the advantageous effect to suppress a reduction in bias voltage caused of the resistance value of the second counter electrode 18.

A blocking layer that inhibits flowing of the electric charge into the pixel electrode in dark time may be provided between the pixel electrode and the photoelectric conversion layer.

The imaging device 100 of the first embodiment has a multilayer structure. The "multilayer" means that the multiple photoelectric conversion layers exist in the normal direction of the semiconductor substrate 1. Since the areas of the pixel electrodes are sufficiently ensured in the multilayer structure, it is advantageous to improve the sensitivity of the pixels. Since the three photoelectric conversion layers 121, 122, and 123 exist in the first embodiment, the imaging device 100 has a three-layer structure. The photoelectric conversion layers 121, 122, and 123 typically have different photoelectric conversion characteristics.

In the imaging device 100 having the three-layer structure, the three photoelectric conversion layers may include the photoelectric conversion layer having sensitivity to blue light, the photoelectric conversion layer having sensitivity to green light, and the photoelectric conversion layer having sensitivity to red light. Accordingly, the three-layer structure is suitable for formation of a full-color image.

In the first embodiment, the first counter electrode 17 is arranged between the first photoelectric conversion layer 121 and the second photoelectric conversion layer 122. The second counter electrode 18 is arranged between the second photoelectric conversion layer 122 and the third photoelectric conversion layer 123. The first counter electrode 17 is the electrode shared between the first photoelectric conversion layer 121 and the second photoelectric conversion layer 122. The second counter electrode 18 is electrically connected to the third photoelectric conversion layer 123 between the first photoelectric conversion layer 121 and the third photoelectric conversion layer 123. The "shared electrode" means that the same voltage is applied to the first photoelectric conversion layer 121 and the second photoelectric conversion layer 122 by the first counter electrode 17.

In other words, the first pixel electrode 13, the first photoelectric conversion layer 121, the first counter electrode 17, the second photoelectric conversion layer 122, the second pixel electrode 14, the second counter electrode 18, the third photoelectric conversion layer 123, and the third pixel electrode 15 are arranged in this order. This positional relationship is established in the other embodiments.

Since certain voltage (for example, +10 V) is applied to the first counter electrode 17 and the second counter electrode 18, the first counter electrode 17 and the second counter electrode 18 each function as an electric shield. The first pixel electrode 13 and the second pixel electrode 14 are electrically shielded by the first counter electrode 17. This suppresses the capacitive coupling between the first pixel electrode 13 and the second pixel electrode 14. Since the second counter electrode 18 is arranged between the second pixel electrode 14 and the third pixel electrode 15, the second pixel electrode 14 and the third pixel electrode 15 are electrically shielded by the second counter electrode 18. This suppresses the capacitive coupling between the second pixel electrode 14 and the third pixel electrode 15.

According to the first embodiment, the first pixel electrode 13, the first counter electrode 17, and the second pixel electrode 14 are arranged in this order above the semiconductor substrate 1. This structure is advantageous to suppression of the color mixture that is electrically caused.

Some other embodiments will be described below. The same reference numerals are added to the components common to the first embodiment and the other embodiments and a description of such components may be omitted. The description of the respective embodiments is mutually applied without any technical contradiction. The respective embodiments may be combined with each other without any technical contradiction.

Second Embodiment

Figure 3:
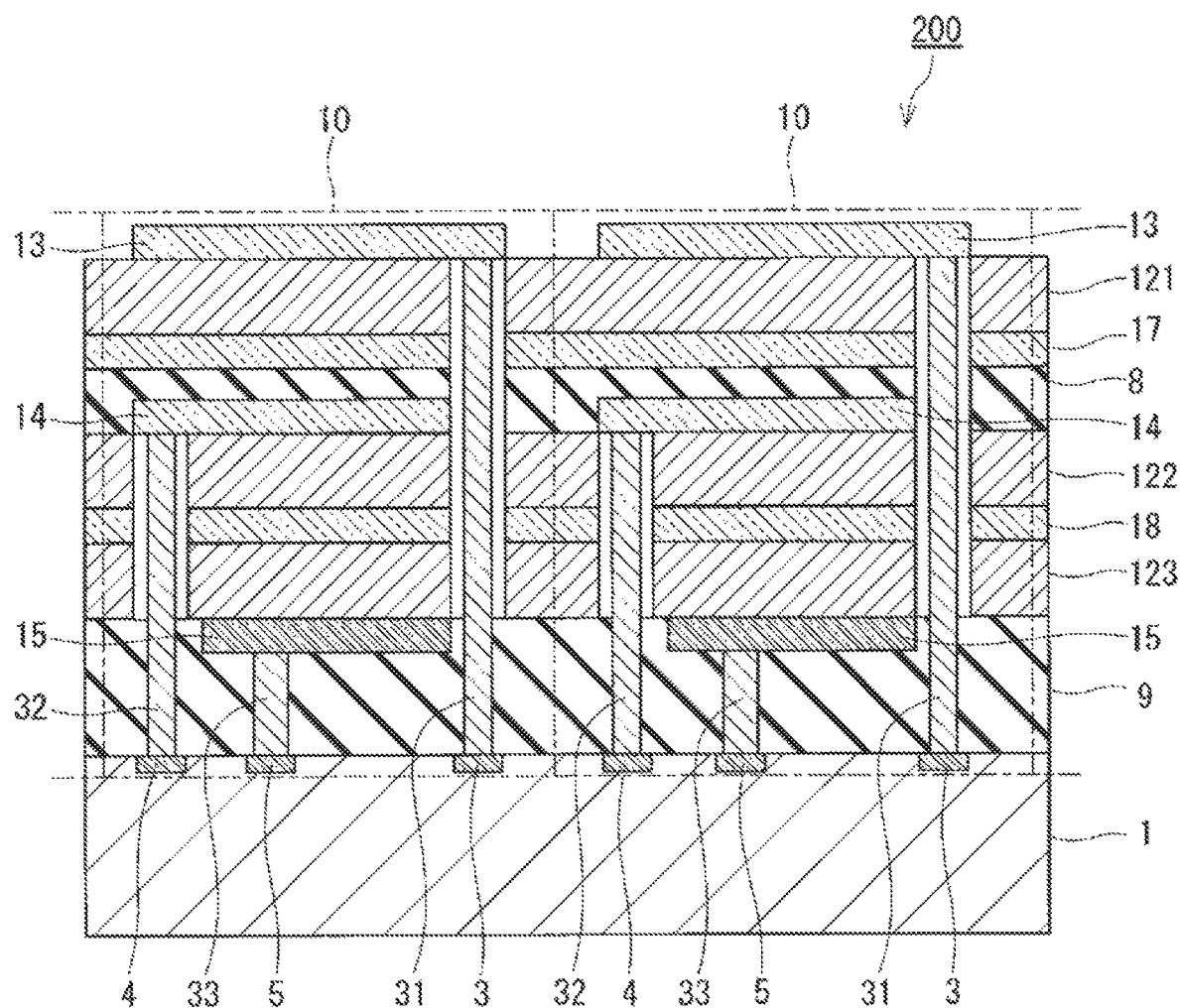
FIG. 3 is a cross-sectional view of an imaging device according to a second embodiment of the present disclosure.

FIG. 3 illustrates a cross section of an imaging device 200 according to a second embodiment of the present disclosure. In the second embodiment, the second counter electrode 18 is shared between the second photoelectric conversion layer 122 and the third photoelectric conversion layer 123. The first counter electrode 17 is in contact with the first photoelectric conversion layer 121 between the first photoelectric conversion layer 121 and the second photoelectric conversion layer 122.

The first pixel electrode 13 and the second pixel electrode 14 are electrically shielded by the first counter electrode 17. This suppresses the capacitive coupling between the first pixel electrode 13 and the second pixel electrode 14. Since the second counter electrode 18 is arranged between the second pixel electrode 14 and the third pixel electrode 15, the second pixel electrode 14 and the third pixel electrode 15 are electrically shielded by the second counter electrode 18. This suppresses the capacitive coupling between the second pixel electrode 14 and the third pixel electrode 15.

The first counter electrode 17 may be thicker than the first pixel electrode 13. As described above in the first embodiment with reference to FIG. 2B, this achieves the advantageous effect to suppress the reduction in bias voltage caused by the resistance value of the first counter electrode 17.

The second counter electrode 18 may be thicker than the second pixel electrode 14. As described above in the first embodiment with reference to FIG. 2C, this achieves the advantageous effect to suppress the reduction in bias voltage caused by the resistance value of the second counter electrode 18.

The second counter electrode 18 may be thicker than the third pixel electrode 15. As described above in the first embodiment with reference to FIG. 2C, this achieves the advantageous effect to suppress the reduction in bias voltage caused by the resistance value of the second counter electrode 18.

Third Embodiment

Figure 4:
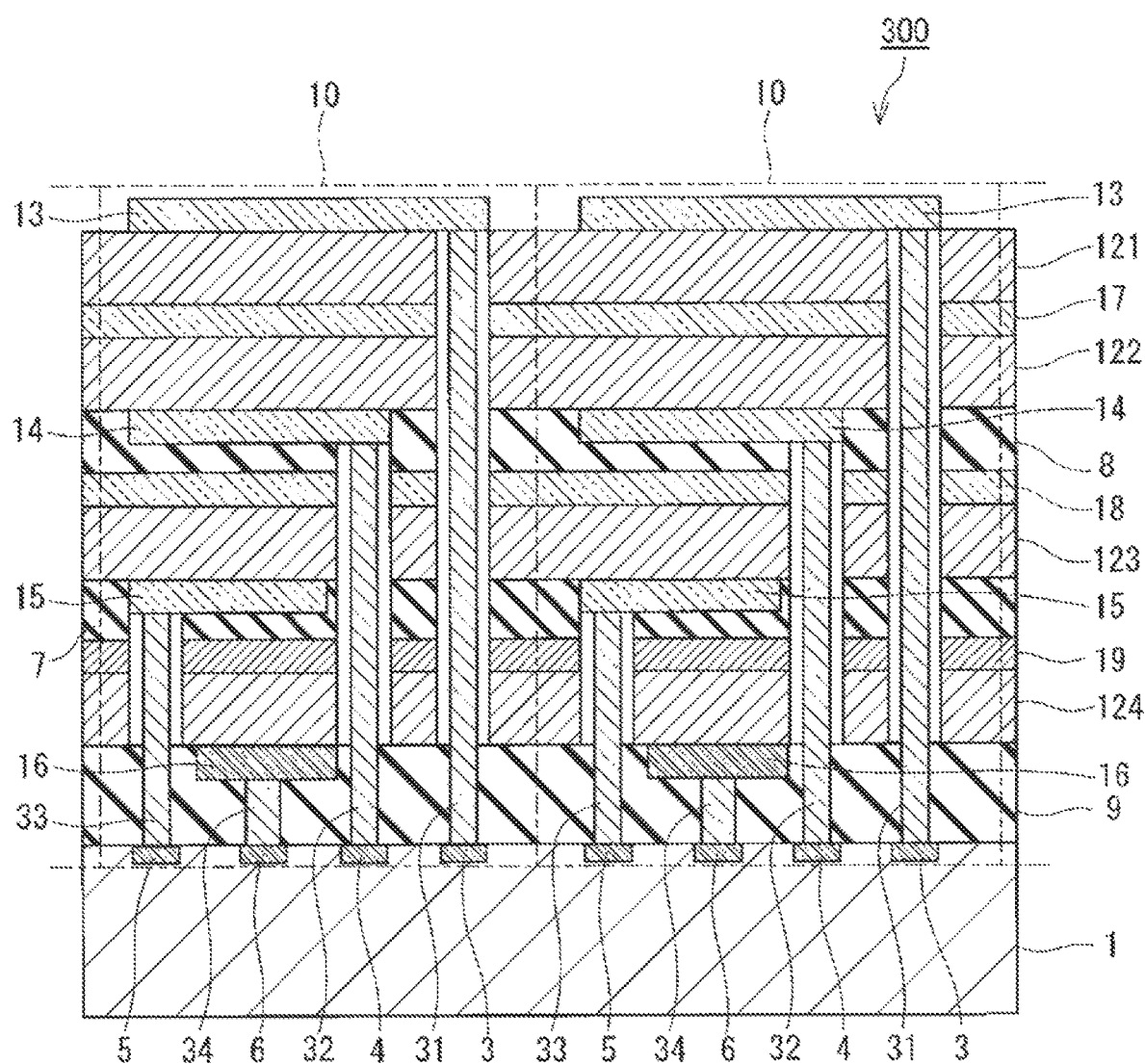
FIG. 4 is a cross-sectional view of an imaging device according to a third embodiment of the present disclosure.

FIG. 4 illustrates a cross section of an imaging device 300 according to a third embodiment of the present disclosure. Each pixel 10 in the imaging device 300 further includes a third counter electrode 19, a fourth photoelectric conversion layer 124, a fourth pixel electrode 16, a fourth plug 34, and a fourth charge accumulation region 6.

The fourth photoelectric conversion layer 124 is arranged between the third photoelectric conversion layer 123 and the semiconductor substrate 1. Specifically, the fourth pixel electrode 16 is arranged between the fourth photoelectric conversion layer 124 and the semiconductor substrate 1. The fourth pixel electrode 16 is electrically connected to the fourth photoelectric conversion layer 124. The fourth pixel electrode 16 collects electric charge corresponding to light in a fourth wavelength region. The fourth wavelength region is, for example, the wavelength region of the near-infrared light. In other words, the first photoelectric conversion layer 121, the second photoelectric conversion layer 122, and the third photoelectric conversion layer 123 are layers for forming a full-color image and the fourth photoelectric conversion layer 124 is a layer for forming an image based on the near-infrared light. The third counter electrode 19 is arranged between the third pixel electrode 15 and the fourth photoelectric conversion layer 124. An insulating layer 7 is provided between the third pixel electrode 15 and the fourth photoelectric conversion layer 124.

In the third embodiment, the first counter electrode 17 is shared between the first photoelectric conversion layer 121 and the second photoelectric conversion layer 122. The second counter electrode 18 is electrically connected to the third photoelectric conversion layer 123 between the second photoelectric conversion layer 122 and the third photoelectric conversion layer 123. The third counter electrode 19 is electrically connected to the fourth photoelectric conversion layer 124 between the third photoelectric conversion layer 123 and the fourth photoelectric conversion layer 124.

The first pixel electrode 13 and the second pixel electrode 14 are electrically shielded by the first counter electrode 17. This suppresses the capacitive coupling between the first pixel electrode 13 and the second pixel electrode 14. The second pixel electrode 14 and the third pixel electrode 15 are electrically shielded by the second counter electrode 18. This suppresses the capacitive coupling between the second pixel electrode 14 and the third pixel electrode 15. The third pixel electrode 15 and the fourth pixel electrode 16 are electrically shielded by the third counter electrode 19. This suppresses the capacitive coupling between the third pixel electrode 15 and the fourth pixel electrode 16.

Fourth Embodiment

Figure 5:
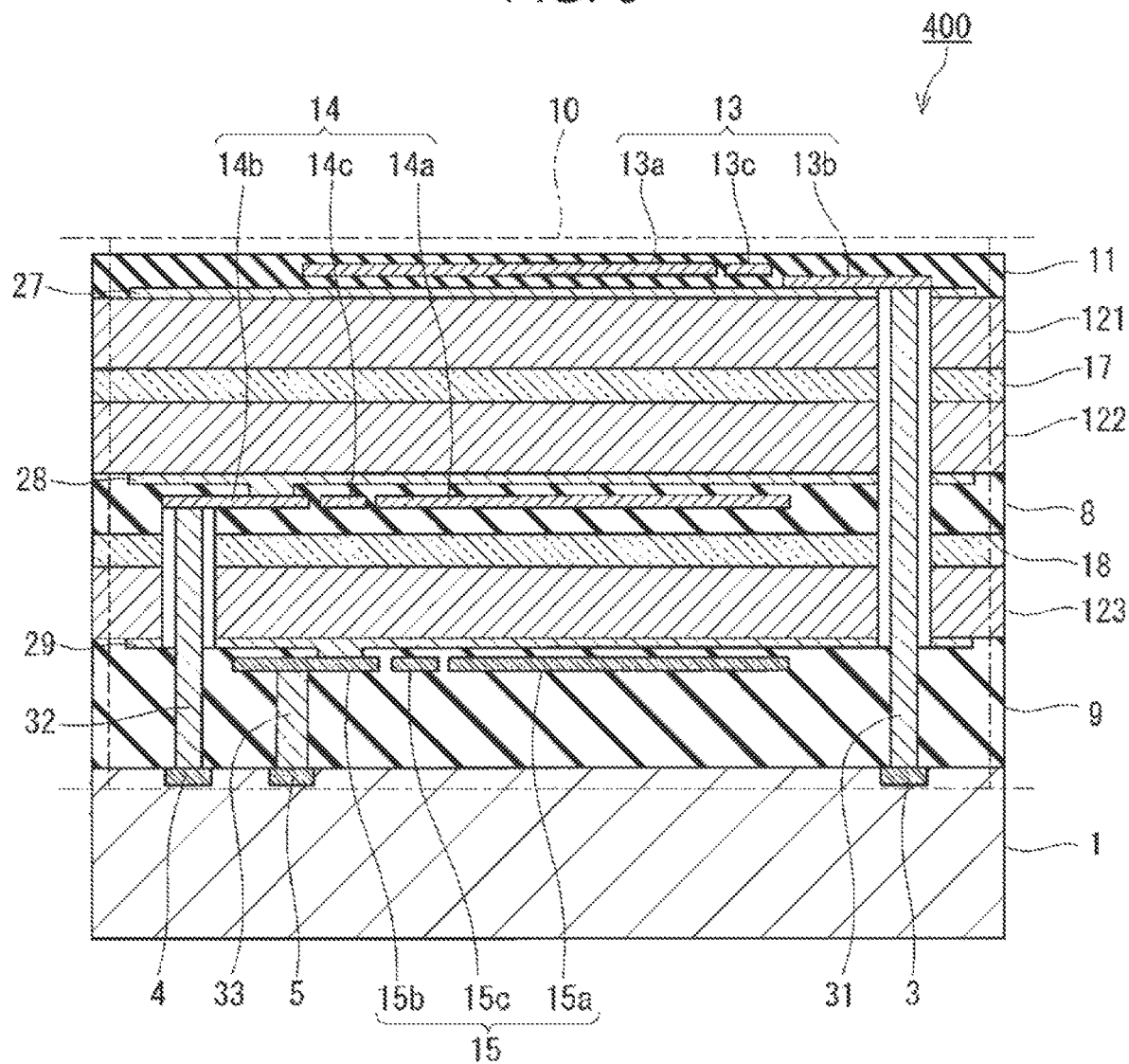
FIG. 5 is a cross-sectional view of an imaging device according to a fourth embodiment of the present disclosure.

FIG. 5 illustrates a cross section of an imaging device 400 according to a fourth embodiment of the present disclosure. The imaging device 400 differs from the imaging devices according to the above embodiments described above in the structure of the electrodes. In the imaging device 400, the first pixel electrode 13 includes a first storage electrode 13*a*, a first readout electrode 13*b*, and a first transfer electrode 13*c*. The second pixel electrode 14 includes a second storage electrode 14*a*, a second readout electrode 14*b*, and a second transfer electrode 14*c*. The third pixel electrode 15 includes a third storage electrode 15*a*, a third readout electrode 15*b*, and a third transfer electrode 15*c*. The transfer electrodes 13*c*, 14*c*, and 15*c* may be omitted.

An insulating layer 11 is provided above the first photoelectric conversion layer 121. A first semiconductor layer 27 is provided between the first pixel electrode 13 and the first photoelectric conversion layer 121. A part of the insulating layer 11 exists between the first semiconductor layer 27 and the first pixel electrode 13. A second semiconductor layer 28 is provided between the second pixel electrode 14 and the second photoelectric conversion layer 122. A part of the insulating layer 8 exists between the second semiconductor layer 28 and the second pixel electrode 14. A third semiconductor layer 29 is provided between the third pixel electrode 15 and the third photoelectric conversion layer 123. A part of the insulating layer 9 exists between the third semiconductor layer 29 and the third pixel electrode 15. The semiconductor layers 27, 28, and 29 are provided to perform the storage of the electric charge more efficiently and are made of a semiconductor material having the light transmittance.

The first storage electrode 13*a* and the first transfer electrode 13*c* are opposed to the first photoelectric conversion layer 121 via a part of the insulating layer 11 or via a part of the insulating layer 11 and the first semiconductor layer 27. At least part of the first readout electrode 13*b* is in contact with the first photoelectric conversion layer 121 directly or via the first semiconductor layer 27. The first plug 31 is connected to the first readout electrode 13*b*. The first storage electrode 13*a*, the first readout electrode 13*b*, and the first transfer electrode 13*c* are electrically connected to lines (not illustrated). Desired voltage may be applied to each of the first storage electrode 13*a*, the first readout electrode 13*b*, and the first transfer electrode 13*c*. The first storage electrode 13*a* may function as a charge storage electrode for attracting the electric charge occurring in the first photoelectric conversion layer 121 and storing the electric charge in the first photoelectric conversion layer 121 in accordance with the applied voltage. In a plan view of the imaging device 400, the first transfer electrode 13*c* is arranged between the first storage electrode 13*a* and the first readout electrode 13*b*. The first transfer electrode 13*c* has a role to hold the stored electric charge and control the transfer of the electric charge. Control of the voltage applied to the first storage electrode 13*a*, the first readout electrode 13*b*, and the first transfer electrode 13*c* enables the electric charge occurring in the first photoelectric conversion layer 121 to be stored in the first photoelectric conversion layer 121 or on the boundary face of the first photoelectric conversion layer 121 and enables the electric charge occurring in the first photoelectric conversion layer 121 to be extracted to the first charge accumulation region 3. The above description about the first pixel electrode 13 is applicable to the second pixel electrode 14 and the third pixel electrode 15 by replacing the "first" with the "second" or the "third".

With the structure of the electrodes of the fourth embodiment, it is possible to efficiently collect and transfer the electric charge occurring in the photoelectric conversion layers to improve the sensitivity. The structure of the electrodes of the fourth embodiment is applicable to all the embodiments described above.

The technique disclosed in this specification is useful for the imaging device. The imaging device is applicable to an imaging apparatus, an optical sensor, and so on. The imaging apparatus is, for example, a digital camera, a medical camera, a monitoring camera, a robot camera, or a vehicle camera.

What is claimed is:

1. An imaging device comprising:
a plurality of pixels, wherein:
each of the plurality of pixels includes:
a first photoelectric conversion layer that converts light into first electric charge,
a first pixel electrode that collects the first electric charge,
a second photoelectric conversion layer that is arranged below the first photoelectric conversion layer and that converts light into second electric charge,
a second pixel electrode that collects the second electric charge,
a third photoelectric conversion layer that is arranged below the second photoelectric conversion layer and that converts light into third electric charge,
a third pixel electrode that collects the third electric charge,
a first counter electrode that is arranged between the first photoelectric conversion layer and the second photoelectric conversion layer, and
a second counter electrode that is arranged between the second photoelectric conversion layer and the third photoelectric conversion layer, and
the first pixel electrode, the first photoelectric conversion layer, the first counter electrode, the second photoelectric conversion layer, the second pixel electrode, the second counter electrode, the third photoelectric conversion layer, and the third pixel electrode are arranged in this order, without interposing any photoelectric conversion layer between the second pixel electrode and the second counter electrode.

2. The imaging device according to claim 1, wherein the first counter electrode is thicker than the second counter electrode.

3. The imaging device according to claim 1, wherein the second counter electrode is thicker than the first counter electrode.

4. The imaging device according to claim 1, wherein the first counter electrode is thicker than the first pixel electrode.

5. The imaging device according to claim 1, wherein the first counter electrode is thicker than the second pixel electrode.

6. The imaging device according to claim 1, wherein the second counter electrode is thicker than the third pixel electrode.

7. The imaging device according to claim 1, further comprising:
a semiconductor substrate,
wherein the first pixel electrode includes a first storage electrode that stores the first electric charge in the first photoelectric conversion layer and a first readout electrode that is electrically connected to the semiconductor substrate,
the second pixel electrode includes a second storage electrode that stores the second electric charge in the second photoelectric conversion layer and a second readout electrode that is electrically connected to the semiconductor substrate, and
the third pixel electrode includes a third storage electrode that stores the third electric charge in the third photoelectric conversion layer and a third readout electrode that is electrically connected to the semiconductor substrate.

8. The imaging device according to claim 1, wherein
the plurality of pixels include a first pixel and a second pixel adjacent to the first pixel, and
the second photoelectric conversion layer of the first pixel is electrically connected to the second photoelectric conversion layer of the second pixel.

9. The imaging device according to claim 1, wherein the number of photoelectric conversion layers between the first pixel electrode and the third pixel electrode is three.

10. The imaging device according to claim 1, further comprising:
a semiconductor substrate; and
a plug through which the first pixel electrode is electrically connected to the semiconductor substrate,
wherein the plug penetrates the second photoelectric conversion layer outside an outer periphery of the second pixel electrode.

11. The imaging device according to claim 1, wherein a voltage is applied to the second counter electrode.

12. An imaging device comprising:
a plurality of pixels, wherein:
each of the plurality of pixels includes:
a first photoelectric conversion layer that converts light into first electric charge,
a first pixel electrode that collects the first electric charge,
a second photoelectric conversion layer that is arranged below the first photoelectric conversion layer and that converts light into second electric charge,
a second pixel electrode that collects the second electric charge,
a third photoelectric conversion layer that is arranged below the second photoelectric conversion layer and that converts light into third electric charge,
a third pixel electrode that collects the third electric charge, a first counter electrode that is arranged between the first photoelectric conversion layer and the second photoelectric conversion layer, and
a second counter electrode that is arranged between the second photoelectric conversion layer and the third photoelectric conversion layer, and
the first pixel electrode, the first photoelectric conversion layer, the first counter electrode, the second pixel electrode, the second photoelectric conversion layer, the second counter electrode, the third photoelectric conversion layer, and the third pixel electrode are arranged in this order, without interposing any photoelectric conversion layer between the first counter electrode and the second pixel electrode.

13. The imaging device according to claim 12, wherein the first counter electrode is thicker than the second counter electrode.

14. The imaging device according to claim 12, wherein the second counter electrode is thicker than the first counter electrode.

15. The imaging device according to claim 12, wherein the first counter electrode is thicker than the first pixel electrode.

16. The imaging device according to claim 12, wherein the second counter electrode is thicker than the second pixel electrode.

17. The imaging device according to claim 12, wherein the second counter electrode is thicker than the third pixel electrode.

18. The imaging device according to claim 12, further comprising:
- a semiconductor substrate, wherein
  - the first pixel electrode includes a first storage electrode that stores the first electric charge in the first photoelectric conversion layer and a first readout electrode that is electrically connected to the semiconductor substrate,
  - the second pixel electrode includes a second storage electrode that stores the second electric charge in the second photoelectric conversion layer and a second readout electrode that is electrically connected to the semiconductor substrate, and
  - the third pixel electrode includes a third storage electrode that stores the third electric charge in the third photoelectric conversion layer and a third readout electrode that is electrically connected to the semiconductor substrate.

19. The imaging device according to claim 12, wherein the plurality of pixels include a first pixel and a second pixel adjacent to the first pixel, and
the second photoelectric conversion layer of the first pixel is electrically connected to the second photoelectric conversion layer of the second pixel.

20. The imaging device according to claim 12, wherein the number of photoelectric conversion layers between the first pixel electrode and the third pixel electrode is three.

21. The imaging device according to claim 12, further comprising:
- a semiconductor substrate; and
- a plug through which the first pixel electrode is electrically connected to the semiconductor substrate,
  wherein the plug penetrates the second photoelectric conversion layer outside an outer periphery of the second pixel electrode.

22. The imaging device according to claim 12, wherein a voltage is applied to the first counter electrode.

23. An imaging device comprising:
a plurality of pixels, wherein:
each of the plurality of pixels includes:
- a first photoelectric conversion layer that converts light into first electric charge,
- a first pixel electrode that collects the first electric charge,
- a second photoelectric conversion layer that is arranged below the first photoelectric conversion layer and that converts light into second electric charge,
- a second pixel electrode that collects the second electric charge,
- a third photoelectric conversion layer that is arranged below the second photoelectric conversion layer and that converts light into third electric charge,
- a third pixel electrode that collects the third electric charge,
- a first counter electrode that is arranged between the first photoelectric conversion layer and the second photoelectric conversion layer,
- a second counter electrode that is arranged between the second photoelectric conversion layer and the third photoelectric conversion layer,
- a fourth photoelectric conversion layer that is arranged below the third photoelectric conversion layer and that converts light into fourth electric charge,
- a fourth pixel electrode that collects the fourth electric charge, and
- a third counter electrode that is arranged between the fourth photoelectric conversion layer and the third pixel electrode, and
the first pixel electrode, the first photoelectric conversion layer, the first counter electrode, the second photoelectric conversion layer, the second pixel electrode, the second counter electrode, the third photoelectric conversion layer, and the third pixel electrode are arranged in this order.

* * * * *